(12) United States Patent
Huang et al.

(10) Patent No.: US 12,333,219 B1
(45) Date of Patent: Jun. 17, 2025

(54) METHOD AND DEVICE FOR CONSTRUCTING REDUNDANCY-REMOVED COPRIME RADAR ARRAY BASED ON ONE-BIT QUANTIZATION

(71) Applicant: SHENZHEN UNIVERSITY, Guangdong (CN)

(72) Inventors: Lei Huang, Shenzhen (CN); Tianyao Long, Shenzhen (CN); Mingyang Chen, Shenzhen (CN); Qiang Li, Shenzhen (CN); Wei Wang, Shenzhen (CN); Xiaopeng Li, Shenzhen (CN)

(73) Assignee: SHENZHEN UNIVERSITY, Shenzhen (CN)

( * ) Notice: Subject to any disclaimer, the term of this patent is extended or adjusted under 35 U.S.C. 154(b) by 0 days.

(21) Appl. No.: 18/743,722

(22) Filed: Jun. 14, 2024

(30) Foreign Application Priority Data

Dec. 28, 2023 (CN) .......................... 202311831015.8

(51) Int. Cl.
*G06F 30/13* (2020.01)
*G01S 7/40* (2006.01)

(52) U.S. Cl.
CPC ................ *G06F 30/13* (2020.01); *G01S 7/40* (2013.01)

(58) Field of Classification Search
CPC .................... G06F 30/13; G01S 7/40
See application file for complete search history.

(56) References Cited

U.S. PATENT DOCUMENTS

| 10,602,265 | B2* | 3/2020 | Xiang | G01S 3/8083 |
| 11,119,183 | B2* | 9/2021 | Alawsh | G01S 7/282 |
| 2020/0200861 | A1* | 6/2020 | Alawsh | G01S 5/06 |
| 2021/0311182 | A1 | 10/2021 | Sun | |
| 2021/0382165 | A1 | 12/2021 | Choi et al. | |

FOREIGN PATENT DOCUMENTS

| CN | 111665468 A | 9/2020 |
| CN | 113093144 A | 7/2021 |
| CN | 114839604 A | 8/2022 |

(Continued)

OTHER PUBLICATIONS

Notification to Grant Patent Right issued on Mar. 8, 2024 in corresponding Chinese Application No. 202311831015.8; 6 pages.

(Continued)

*Primary Examiner* — Timothy X Pham
(74) *Attorney, Agent, or Firm* — Maier & Maier, PLLC

(57) ABSTRACT

A method and a device for constructing a redundancy-removed coprime radar array based on one-bit quantization. The method includes obtaining a first sub-array element and a second sub-array element both used for constructing a redundancy-removed coprime radar array, and determining a redundancy-removed coprime array respectively corresponding to the first sub-array element and the second sub-array element by a graph theory method; obtaining target echo data of the redundancy-removed coprime array, and obtaining a target radar array by performing one-bit quantization on the target echo data for completing array cavities of the redundancy-removed coprime array; moreover, before the completing, positions of all non-empty array elements in a redundancy coprime array are used to place radars, and before the completing, the radars are not arranged in positions of empty array elements.

8 Claims, 5 Drawing Sheets

(56) References Cited

FOREIGN PATENT DOCUMENTS

| | | | |
|---|---|---|---|
| CN | 115421157 A | | 12/2022 |
| EP | 4513223 | * | 8/2023 |

OTHER PUBLICATIONS

Chen et al., "Joint DOD and DOA Estimation with High Accuracy in Bistatic MIMO Radar Using Sparse Array", Journal of Applied Science, Sep. 30, 2015, vol. 33, No. 5, 14 pages.
Office Action issued on Feb. 7, 2024 in corresponding Chinese Application No. 202311831015.8; 9 pages.

* cited by examiner

METHOD AND DEVICE FOR CONSTRUCTING REDUNDANCY-REMOVED COPRIME RADAR ARRAY BASED ON ONE-BIT QUANTIZATION

CROSS-REFERENCE TO RELATED APPLICATIONS

This application claims priority to Chinese Patent Application No. 202311831015.8, filed on Dec. 28, 2023, the content of all of which is incorporated herein by reference.

TECHNICAL FIELD

The present disclosure relates to the technical field of radars, in particular to a method and a device for constructing a redundancy-removed coprime radar array based on one-bit quantization.

BACKGROUND

As one sparse linear array (SLA) structure, the coprime array is widely used. The coprime array consists of two uniform linear arrays (ULAs) with the quantities of array elements of the two ULAs being coprime, an interval between the array elements of one ULA is one less than the quantity of the array elements of another ULA, and an interval between the array elements of the another ULA is one less than the quantity of the array elements of the one ULA. However, due to the high redundancy of the coprime array is higher than that of a nested array, the coprime array needs more physical array elements to reach the same aperture size as the nested array, which increases the construction cost of the coprime array.

Therefore, the prior art still needs to be improved and developed.

SUMMARY

To solve the above-mentioned defect of the prior art, the purpose of the present disclosure aims to provide a method and a device for constructing a redundancy-removed coprime radar array based on one-bit quantization to solve the defect that the construction cost of the coprime array is expensive due to the high redundancy of the coprime array.

To achieve the above purpose, the present disclosure adopts the following technical schemes.

The first aspect of the present disclosure provides a method for constructing a redundancy-removed coprime radar array, including following steps:

Obtaining a first sub-array element and a second sub-array element both used for constructing a redundancy-removed coprime radar array, and determining a redundancy-removed coprime array respectively corresponding to the first sub-array element and the second sub-array element by a graph theory method; and Obtaining target echo data of the redundancy-removed coprime array, and obtaining a target radar array by performing one-bit quantization on the target echo data for completing array cavities of the redundancy-removed coprime array; moreover, before the completing, positions of all non-empty array elements in a redundancy coprime array are used to place radars, and before the completing, the radars are not arranged in the positions of empty array elements.

In one implementation, the step of obtaining a first sub-array element and a second sub-array element used for constructing a redundancy-removed coprime radar array; and determining redundancy-removed coprime arrays respectively corresponding to the first sub-array element and the second sub-array element by a graph theory method further includes following steps of:

Obtaining an angular resolution of the target radar array, and determining an array aperture of the target radar array according to the angular resolution;

Selecting the first sub-array element and the second sub-array element used for constructing the redundancy-removed coprime radar array according to the array aperture, and constructing an initial coprime array based on the first sub-array element and the second sub-array element; and Selecting the redundancy-removed coprime array from the initial coprime array by the graph theory method.

In one implementation, the step of selecting the redundancy-removed coprime array from the initial coprime array by the graph theory method further includes following steps of:

Fixing a head array element and a tail array element of the initial coprime array;

Traversing all coprime sub-arrays in the initial coprime array and calculating a poor joint array of each coprime sub-array; and According to connectivity of an undirected graph corresponding to the poor joint array of the each coprime sub-array, selecting the redundancy-removed coprime array from all the coprime sub-arrays; in which the redundancy-removed coprime array is a smallest coprime sub-array with non-connectivity in the undirected graphs of all coprime sub-arrays.

In one implementation, the step of according to connectivity of an undirected graph corresponding to the poor joint array of the each coprime sub-array, selecting the redundancy-removed coprime array from all the coprime sub-arrays further includes following steps of:

For the each coprime sub-array, taking a non-negative set of array element position sets of the poor joint array of the corresponding coprime sub-array to obtain the poor joint array;

Filling cavity-positions of the coprime sub-array to obtain a Hankel Matrix corresponding to the coprime sub-array and making the Hankel Matrix as the undirected graph; and Determining the connectivity of the undirected graph based on a preset connectivity judgment basis; and the preset connectivity judgment basis is:

$$\forall m \in M = S + S^2 + \ldots + S^{q-1}, m \neq 0,$$

where q represents an order of the matrix S, and S represents the Hankel Matrix; and $$\|S\|_1 > 2\lceil L/2 \rceil - 1,$$

where L represents the array aperture, and $\|S\|_1$ represents a quantity of total edges of the matrix.

In one implementation, the step of obtaining a target radar array by performing one-bit quantization to the target echo data for completing array cavities further includes:

Performing cavity completion on the target echo data to obtain completed echo data;

Performing one-bit quantization to the completed echo data to determine a received signal of the poor joint array; and Based on the received signal of the poor joint array, constructing a completion problem corresponding to the redundancy-removed coprime array, and solving the completion problem by using Singular Value Thresholding (SVT) to obtain the target radar array.

In one implementation, the step of performing one-bit quantization to the completed echo data to determine a received signal of the poor joint array further includes:

Performing the one-bit quantization to the completed echo data to determine a one-bit signal; and Obtaining covariance matrix estimation of the one-bit signal and performing vectorization to the covariance matrix estimation to obtain the received signal of the poor joint array.

In one implementation, the step of based on the received signal of the poor joint array, constructing a completion problem corresponding to the redundancy-removed coprime array further includes following steps of:

Constructing Toeplitz Matrix based on the received signal of the poor joint array;

Taking an observation-matrix minimization problem corresponding to the Toeplitz Matrix as an initial completion problem corresponding to the redundancy-removed coprime array; and Relaxing the initial completion problem into a convex completion problem by nuclear norm.

The second aspect of one embodiment of the present disclosure provides a device for constructing a redundancy-removed coprime radar array, including the following modules:

An input array acquiring module used for obtaining a first sub-array element and a second sub-array element both used for constructing a redundancy-removed coprime radar array, and determining a redundancy-removed coprime array respectively corresponding to the first sub-array element and the second sub-array element by a graph theory method; and A target array completing module used for obtaining target echo data of the redundancy-removed coprime array, and obtaining a target radar array by performing one-bit quantization on the target echo data for completing array cavities of the redundancy-removed coprime array; moreover, before the completing, positions of all non-empty array elements in a redundancy coprime array are used to place radars, and before the completing, the radars are not arranged in the positions of empty array elements.

The third aspect of one embodiment of the present disclosure provides a terminal device, including a memory, a processor, and a program stored in the memory and executable by the processor, when the program is executed by the processor, the above-mentioned steps of a method for constructing a redundancy-removed coprime radar array are implemented.

The forth aspect of one embodiment of the present disclosure provides a computer-readable storage medium, in which the program of a redundancy-removed coprime radar array is stored, when the program is executed by the processor, the above-mentioned steps of a method for constructing a redundancy-removed coprime radar array are implemented.

Beneficial effects: The present disclosure provides a method and a device for constructing a redundancy-removed coprime radar array based on one-bit quantization to solve the problem of high cost, high complexity, and high redundancy of direction-of-arrival (DoA) estimation by combining the graph theory method with the one-bit quantization technology. By optimizing an initial SLA structure into a redundancy-removed coprime array (RRCA), not only the array freedom of radar system is improved, but also the quantity of physical array elements is reduced. In addition, the one-bit quantization strategy is adopted, so that the cost of the analog-to-digital converter (ADC) is reduced, the system power consumption is reduced, and the hardware requirements and the data volume processed by subsequent signal processing are effectively reduced, thereby achieving the purpose of reducing the overall system cost. Meanwhile, the present disclosure can accurately recover the positions of the array element cavities by combining the signal completion technology, thereby utilizing the data of all array apertures and avoiding data waste.

DETAILED DESCRIPTION OF EMBODIMENTS

Figure 1:
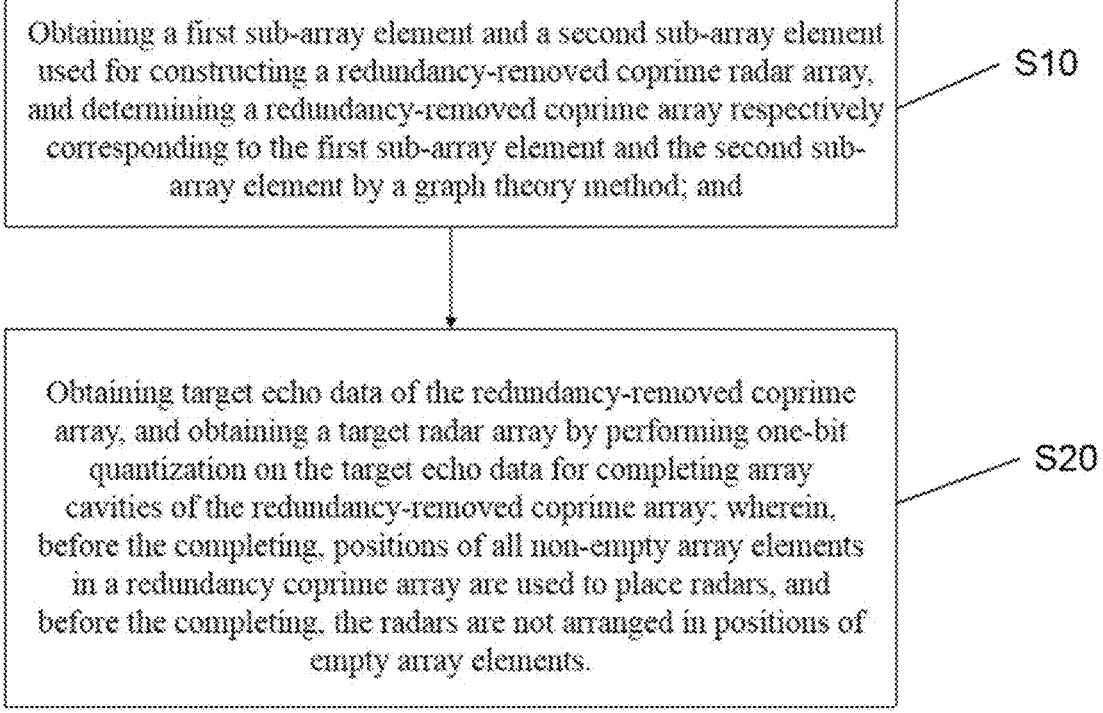
FIG. 1 is a flow diagram of a method for constructing a redundancy-removed coprime radar array based on one-bit quantization of the present disclosure.

The present disclosure provides a method and a device for constructing a redundancy-removed coprime radar array based on one-bit quantization. In order to make the purposes, the technical schemes, and the effects of the present disclosure more clear and definite, more details of the present disclosure are completely described in combination with the attached drawings in the embodiments of the present disclosure. It should be understood that the specific embodiments described herein are only used to explain the present disclosure, and are not used to limit the present disclosure.

It can be understood by those skilled in the art that the singular forms "a", "an", and "the" used herein can also include plural forms unless specifically stated. It should be further understood that the words "comprise" and "include" used in the specification of the present disclosure refer to the presence of the features, integers, steps, operations, elements and/or components, but does not exclude the presence or addition of one or more other features, integers, steps, operations, elements, components and/or groups thereof. It should be understood that when we say that one component is "connected" or "coupled" to another component, it can be directly connected or coupled to the another component, or intervening components may also exist. Furthermore, "connected" or "coupled" as used herein may include wireless connection or wireless coupling. As used herein, the phrase "and/or" includes all or any unit and all combinations of one or more associated listed items.

It can be understood by those skilled in the art that, unless otherwise defined, all terms (including technical terms and scientific terms) used herein have the same meaning as commonly understood by ordinary skilled in the art to which the present disclosure belongs. It should also be understood that terms, such as those defined in general dictionaries, should be understood to have meanings consistent with those in the context of the prior art, and are not interpreted in an idealized or overly formal sense unless they are specifically defined as here.

It should be understood that the sequence number and size of each step in the embodiments do not mean the order of execution, and the order of execution of each process is determined by its function and internal logic, and should not constitute any restrictions on the implementation process of the embodiments of the present disclosure.

Fast, accurate, and high-resolution Direction-of-Arrival (DoA) estimation is very important for millimeter-wave radar point cloud. The resolution and freedom of the DoA estimation are limited by the aperture size of radar array. Based on Nyquist Sampling Theorem, a traditional uniform linear array (ULA) requires that an array element interval is a half wavelength. The setting requires increasing the quantity of array elements with the increase of aperture, which leads to a significant increase in system complexity and cost. Compared with the ULA, a sparse linear array (SLA) structure can achieve the same aperture with fewer physical elements by increasing the interval between array elements, which effectively reduces the cost and system redundancy.

After each array element receives the signal, it needs an Analog-to-Digital Converter (ADC) to quantize the signal from analog to digital. The higher the accuracy of the ADC, the greater its cost and power consumption. In an array, each array element needs one ADC, which leads to a linear increase in cost with the increase of array size. One-bit quantization technology reduces the implementation difficulty, cost, and power consumption by replacing an ADC with a comparator, and at the same time reduces the data volume and hardware requirements. Although one-bit quantization destroys the amplitude information of the signal, the accuracy loss of the DoA in spatial spectrum estimation is acceptable.

As one SLA structure, the coprime array is widely used and the coprime array consists of two ULAs with the quantities of array elements of the two ULAs being coprime, an interval between the array elements of one ULA is one less than the quantity of array elements of another ULA, and an interval between the array elements of the another ULA is one less than the quantity of array elements of the one ULA. However, due to the high redundancy of the coprime array is higher than that of a nested array, the coprime array needs more physical array elements to reach the same aperture size as the nested array, which increases the construction cost of the coprime array.

To solve the above-mentioned defect of the prior art, one embodiment of the present disclosure includes the following steps: obtaining a first sub-array element and a second sub-array element both used for constructing a redundancy-removed coprime radar array, and determining a redundancy-removed coprime array respectively corresponding to the first sub-array element and the second sub-array element by a graph theory method; and obtaining target echo data of the redundancy-removed coprime array, and obtaining a target radar array by performing one-bit quantization to the target echo data for completing array cavities of the redundancy-removed coprime array; moreover, before the completing, positions of all non-empty array elements in a redundancy coprime array are used to place radars, and before the completing, the radars are not arranged in the positions of empty array elements. The present disclosure provides a method and a device for constructing a redundancy-removed coprime radar array based on one-bit quantization to solve the problem of high cost, high complexity, and high redundancy of DoA estimation by combining the graph theory method with the one-bit quantization technology. By optimizing an initial SLA structure into a redundancy-removed coprime array (RRCA), not only the array freedom of radar system is improved, but also the quantity of physical array elements is reduced. In addition, the one-bit quantization strategy is adopted, so that the cost of the Analog-to-Digital Converter (ADC) is reduced, the system power consumption is reduced, and the hardware requirements and the data volume processed by subsequent signal processing are effectively reduced, thereby achieving the purpose of reducing the overall system cost. Meanwhile, the present disclosure can accurately recover the positions of the array element cavities by combining the signal completion technology, thereby utilizing the data of all array apertures and avoiding data waste.

The present disclosure is further explained herein by describing more details of the embodiments in combination with the attached drawings.

A method and a device for constructing a redundancy-removed coprime radar array based on one-bit quantization are provided in one embodiment of the present disclosure. As shown in FIG. 1, the method for constructing a redundancy-removed coprime radar array based on one-bit quantization includes steps of:

S10, obtaining a first sub-array element and a second sub-array element both used for constructing a redundancy-removed coprime radar array, and determining a redundancy-removed coprime array respectively corresponding to the first sub-array element and the second sub-array element by a graph theory method.

Specifically, the first sub-array element and the second sub-array element are basic components for constructing a coprime array. After obtaining the first sub-array element and the second sub-array element both used for constructing a redundancy-removed coprime radar array, the graph theory method is used to determine the a redundancy-removed coprime array. In addition, the quantity of array elements of the first sub-array element and the quantity of array elements of the second sub-array element are coprime. The first sub-array element can be an array element located in the first sub-array element, which has N array elements. An array element interval of the first sub-array element is Md, d is a reference distance, and the reference distance can be half a wavelength. The second sub-array element can be an array element located in the second sub-array element, which has M array elements. The M is an integer that is coprime with the N, and an array element interval of the second sub-array element is Nd.

The redundancy-removed coprime array refers to the array obtained by reducing the quantity of physical array elements while retaining the aperture size of the coprime array. In other words, the redundancy-removed coprime array is an efficient radar array design, which not only maintains the performance of coprime array, but also reduces the quantity of physical elements of coprime array.

In one implementation, the step of obtaining a first sub-array element and a second sub-array element both used for constructing a redundancy-removed coprime radar array, and determining a redundancy-removed coprime array respectively corresponding to the first sub-array element and the second sub-array element by a graph theory method further includes following steps of:

S11, obtaining an angular resolution of the target radar array, and determining an array aperture of the target radar array according to the angular resolution;

S12, selecting the first sub-array element and the second sub-array element both used for constructing the redundancy-removed coprime radar array according to the array aperture, and constructing an initial coprime array based on the first sub-array element and the second sub-array element;

S13, selecting the redundancy-removed coprime array from the initial coprime array by the graph theory method.

Specifically, in step S11, the angular resolution is preset as a target value of the target radar array, so that the actual angular resolution of the constructed target radar array can reach the angular resolution. The array aperture is used to reflect the distance from the emission array element to the furthest array element in the target radar array and to limit the angular resolution of the target radar array. Therefore, after obtaining the angular resolution, the array aperture of the target radar array can be determined according to the correspondence between the array aperture and the angular resolution. Among them, the correspondence between the array aperture and the angular resolution is determined based on the array signal processing theory (e.g., using the coprime properties and array signal processing theory, etc.).

Further, in step S12, the initial coprime array is obtained from adding the first sub-array element and the second sub-array element, and since the first element of the first sub-array element and the first element of the second sub-array element are the same, the quantity of array elements of the initial coprime array equals to the sum quantity of the first sub-array element and the second sub-array element minus one.

Specifically, in the case that the first sub-array element has M elements and the second sub-array element has N elements, a position of each physical array element of the initial coprime array (M+N−1) can be expressed as:

$$P=\{mNd|1\leq m\leq M\}\cup\{nMd|1\leq n\leq N\}=\{\rho_1,\rho_2,\ldots,\rho_{M+N-1}\}, \quad (1)$$

where $\rho_i$, i=1, ..., M+N−1 represents the position of the i-th physical array element relative to the first physical array element.

In one implementation, the step of selecting the redundancy-removed coprime array from the initial coprime array by the graph theory method further includes following steps of:

S131, fixing a head array element and a tail array element of the initial coprime array;

S132, traversing all coprime sub-arrays in the initial coprime array and calculating a poor joint array of the each coprime sub-array;

S133, according to connectivity of an undirected graph corresponding to the poor joint array of the each coprime sub-array, selecting the redundancy-removed coprime array from all the coprime sub-arrays; moreover, the redundancy-removed coprime array is the smallest coprime sub-array in all coprime sub-arrays of which the undirected graph has non-connectivity.

Specifically, in step S131, the head array element and tail array element respectively refer to the first array element and the last array element that both constitute the initial coprime array. In the design of the initial coprime array, the array elements are arranged in order with the first array element at the beginning position of the initial coprime array and the tail array element at the end position of the initial coprime array. For the initial coprime array, the array element is arranged in a sequence in accordance with its physical position in the array, the first array is located in the most anterior position which can be set as a reference point, usually position zero (i.e., relative to a reference point, can be regarded as the base point), and the tail array element is located in the last position with its position being the largest, that is to say, the length limit of the initial coprime array is set.

The operation of fixing means that the positions of the head array element and the tail array element are constant. The fixed mode can mean that the positions of the two array elements remain motionless in the process of algorithm calculation or analysis, and do not participate in any possible reconfiguration, optimization and other steps. The purpose of the fixing operation is to maintain the overall size and shape of the initial coprime array to ensure that the performance parameters of the initial coprime array structure are not affected by the array element reduction in the redundancy-removed process.

In step S132, the step of traversing all coprime sub-arrays in the initial coprime array means that a series of subsets obtained from the initial coprime array by removing some arrays or combinations, which still maintain the coprime array characteristics. In order to obtain all coprime sub-arrays, a series of operations on the initial coprime array are needed, which include removing some arrays or changing the combination of the arrays to create new subsets.

The traversing method can be systematic or random, depending on the specific application requirements and the optimization methods. In the present disclosure, the combination of fixing the head and tail array elements can be regarded as a first group of the coprime sub-array, then in each traversing round, adding the remaining array elements into the first group of the coprime sub-array until the quantity of the remaining array element goes to zero, forming all coprime sub-arrays in the initial coprime array.

In addition, the poor joint array of the coprime array is a set obtained from position shift between the physical array elements of the coprime array, and the value of the position shift include positive value, zero value, and negative value. The calculation equation is shown below:

$$S=\{\pm(\rho_i-\rho_j)\}, 0\leq i\leq M+N-1, 0\leq j\leq M+N-1, \quad (2)$$

first, fixing the head array element and the tail array element of the initial coprime array P; then enumerating and traversing all coprime sub-arrays P' of the initial coprime array P; calculating poor joint arrays S' corresponding to all coprime sub-arrays P' by equation (2).

In step S133, based on the poor joint arrays of each coprime sub-arrays obtained in step S132, each array element position in the poor joint array is regarded as a node in the undirected graph. If position shift exists between nodes, connecting the nodes to form an edge, thus forming a series of undirected graphs representing the coprime sub-array. Subsequently, evaluating which undirected graphs corresponding to coprime sub-arrays are connected, and connectivity of the undirected graph means that from either node can reach any other node via the edge.

In one implementation, the step of according to connectivity of an undirected graph corresponding to the poor joint array of the each coprime sub-array, selecting the redundancy-removed coprime array from all the coprime sub-arrays further includes following steps of:

S1331, for the each coprime sub-array, taking a non-negative set of array element position sets of the poor joint array of the corresponding coprime sub-array to obtain the poor joint array;

S1332, filling the cavity-positions of the coprime sub-array to obtain a Hankel Matrix corresponding to the coprime sub-array and making the Hankel Matrix as the undirected graph;

S1333, determining the connectivity of the undirected graph based on a preset connectivity judgment basis; in which the preset connectivity judgment is based on:

$$\forall m \in M = S + S^2 + \ldots + S^{q-1}, m \neq 0,$$

where q represents the order of the matrix S, and S represents the Hankel Matrix; and $$\|S\|_1 > 2\lceil L/2 \rceil - 1,$$

where L represents the array aperture, and $\|S\|_1$ represents the quantity of total edges of the matrix.

Specifically, in step S1331, taking a non-negative set of array element position sets of the poor joint array element S' obtained from the step S132, and the non-negative set particularly includes all non-negative values of array element position sets of the poor joint array element S', i.e. all the position shifts are greater than or equal to zero. By selecting the non-negative values, negative values can be removed. Because in physical space, positions are non-negative. Only non-negative position shifts in coprime array have practical spatial significance and can correspond to the actual physical array design. Furthermore, in the poor joint array, the initial position in the position set of the poor joint array element S' is 1, in which the equation of taking the non-negative set is below:

$$S^+ = \{s+1 | s \geq 0, s \in S\}, \quad (3),$$

Due to the discontinuity of the array element position of the poor joint array, in step S1332, the cavity-positions of the coprime sub-array are filled to be 0 to obtain $S_0$, where the cavity-positions of the coprime sub-array refer to the position points with no physical array elements in the poor joint array formed by position shifts of the physical array elements in the coprime sub-array. In other words, because the physical array elements are not uniformly arranged at all possible positions, these cavities are virtual positions in the virtual arrays that are not occupied by the actual physical array elements.

For instance, based on the above-mentioned coprime defined by the coprime integer pair (N, M), and the array element interval of the Nis Md, the array element interval of the M is Nd, when forming the poor joint array, the virtual array includes all position shifts obtained from the form of mNd−nMd. However, not all of these position shifts correspond to the actual physical array elements, and so some positions are "empty," meaning that there are no corresponding physical array elements at these positions, and these positions are called "cavity-positions".

The filling process of filling the cavity-positions in the coprime sub-array can include the following processes: First, calculating physical array position shifts of all sub-arrays to obtain the poor joint array; constructing a complete degree sequence, which contains all integers from the minimum non-negative difference value (usually 0) to the maximum difference value; in the complete degree sequence, the positions that do not correspond to the difference value in the prime sub-array (i.e. the position point not occupied by the actual array) is identified as the cavity-positions; for the identified cavity-positions, fill them to be 0; in the subsequent signal processing or algorithmic analysis, these positions can be considered as virtual array element locations, but they don't actually contain any physical signals or contributions.

The filled results obtain a "complete" virtual array without any empty interval, but fill all cavity-positions by a 0 value to provide a continuous data set for subsequent data processing and analysis.

In the specific implementation of the present disclosure, the specific filling equation is as follows:

$$S_0[i] = \begin{cases} 1, & i \in S^+ \\ 0, & i \notin S^+ \end{cases}, i = 1, 2, \ldots, L, \quad (4)$$

Where L represents array aperture, $S_0[i]$ represents the i-th coprime sub-array obtained after filling the cavity-positions in the coprime sub-array to be 0.

Furthermore, the Hankel Matrix is a square or rectangular array of same elements arranged along a forward diagonal line. The step of obtaining a Hankel Matrix corresponding to the coprime sub-array includes:

Filling the elements of filled coprime array according to the rules into the matrix, so that the elements located on each forward diagonal line are the same. In the matrix, each row of elements from left to right corresponds to the elements in the sequence, while each column of elements from top to bottom corresponds to the next elements in the sequence. Thus, the Hankel Matrix has constant properties in the diagonal line direction from top right to bottom left.

In the present disclosure, L*d is the utmost array element position in $s^+$ (L is the array aperture, d is reference distance), and is arranged into the Hankel Matrix S:

$$S = \begin{pmatrix} S_0[1] & S_0[2] & \ldots & S_0[\lceil L/2 \rceil] \\ S_0[2] & \cdot^{\cdot^{\cdot}} & S_0[\lceil L/2 \rceil] & \vdots \\ \vdots & S_0[\lceil L/2 \rceil] & \cdot^{\cdot^{\cdot}} & S_0[L-1] \\ S_0[\lceil L/2 \rceil] & \ldots & S_0[L-1] & S_0[L] \end{pmatrix}, \quad (5)$$

Where taking the Hankel Matrix S as an undirected graph is as follows:

The necessary and sufficient conditions for S completion are: S satisfies r-connectivity (that is, S has still connectivity except (r−1) edges), the edges of each vertex are at least r, and the quantity of total edges is greater than r (m+n−r) [1] at the same time, where r represents the rank of the matrix, and m and n are the dimensions of the original matrix respectively. The original matrix is a projection matrix composed of a uniform array without holes, and the rank is 1, so that r=1. In summary, the necessary and sufficient conditions are: at the same time, S satisfies 1-connectivity (that is, connectivity), the edges of each vertex are at least 1, and the quantity of total edges is greater than $2\lceil L/2 \rceil - 1$.

In step S1333, since the edges of each vertex are at least 1, it is only necessary to ensure the connectivity of the undirected graph S, and the quantity of total edges is greater than $2\lfloor L/2 \rfloor - 1$:

$$\forall m \in M = S + S^2 + \ldots + S^{q-1}, m \neq 0, \quad (6)$$

Where q represents the order number of the matrix S; and the quantity of total edges $\|S\|_1 > 2\lceil L/2 \rceil - 1$.

To facilitate understanding the connectivity of the poor joint array set, the following examples are given:

Two poor joint array sets are shown herein $S_1=\{1, 0, 1, 0, 1\}$ and $S_2=\{0, 1, 0, 1, 0\}$, generating the corresponding Hankel Matrices respectively:

$$S_1 = \begin{bmatrix} 1 & 0 & 1 \\ 0 & 1 & 0 \\ 1 & 0 & 1 \end{bmatrix}; S_2 = \begin{bmatrix} 0 & 1 & 0 \\ 1 & 0 & 1 \\ 0 & 1 & 0 \end{bmatrix};$$

Considering $S_1$ and $S_2$ as undirected adjacency graphs, according to equation (6) it can be determined that $S_1$ is a non-connected graph and $S_2$ is a connected graph, but the quantity of total edges does not meet the requirements.

Since the spectral gap of the matrix reflects the distribution of the observed elements in the matrix. The more uniform the distribution of the observed elements, the larger the spectral gap and the less errors of matrix completion. To further improve the accuracy of completion, the spectral gap S required in the present disclosure is sufficiently larger:

$$\mathrm{U}(S) = 1 - \frac{\sigma_2}{\sigma_1} > 0.3, \qquad (7)$$

where $\sigma_1$ and $\sigma_2$ represent the largest singular value and the second largest singular value of the matrix S, respectively.

Finally, a minimum subset $P'_{min}=\{\rho'_i\}$, $i=1, 2, \ldots, \eta$ (that is, the redundancy-removed coprime array) corresponding to the undirected graph S', satisfying equation (6) is generated, where $\rho'_i$ represents the physical position of the i-th array element of the redundancy-removed array; $\eta$, ($\eta \leq M+N-1$) is the size of the subset.

S20, obtaining target echo data of the redundancy-removed coprime array, and obtaining a target radar array by performing one-bit quantization to the target echo data for completing array cavities of the redundancy-removed coprime array; moreover, before the completing, positions of all non-empty array elements in a redundancy coprime array are used to place radars, and before the completing, the radars are not arranged in positions of empty array elements.

Specifically, the target echo data refers to a reflected signal received by a radar system, such as the signal emitted by a radar and then reflected back by a target (e.g. aircraft, ship, and other objects). Echo data can include important information about the target, such as distance, speed, angle, etc. In one specific implementation of the present disclosure, the target echo data refers to data of a plurality of far-field narrow-band signals received from different angles, including time-domain signals.

The one-bit quantization means that during the conversion of continuous simulated signals into discrete digital signals, each sample is quantified as only two possible values, namely 0 and 1 or −1 and 1, reflecting the positive or negative amplitude of an original signal. The one-bit quantization can reduce the generated data volume and simplify the hardware implementation.

The non-empty array element position refers to a position originally having a physical radar array element in the redundancy-removed coprime array (called a non-empty array element position). The non-empty array element position does not require any filling in the array, but the empty array element position is opposite to the non-empty array element position. The empty array element position is a position without a physical radar array element, and before completion, the position is empty. The position for placing a radar means that in a radar system arranged in actual, a radar receiver or sensor is actually placed only in the non-empty array element position, and the radar receiver or sensor is not placed in the empty array element position before completion.

It is emphasized that in step S20, the data of the empty array element position is completed by completing array cavities for the redundancy-removed coprime array, and a state of placing the physical radar in the empty array element position is further simulated, thus to obtain a complete group of target radar array, which is used to simulate a radar array without cavities to improve the computational efficiency.

In one specific implementation, the step of obtaining a target radar array by performing one-bit quantization on the target echo data for completing array cavities of the redundancy-removed coprime array further includes following steps of:

S21, performing cavity completion on the target echo data to obtain completed echo data;

S22, performing the one-bit quantization to the completed echo data to determine a received signal of a poor joint array; and S23, based on the received signal of the poor joint array, constructing a completion problem corresponding to the redundancy-removed coprime array, and solving the completion problem by using singular value thresholding (SVT) to obtain the target radar array.

Specifically, in step S21, the cavity completion refers to processing the echo data received by the redundancy-removed coprime radar array and completing the cavity-position data due to no radar placement in the redundancy-removed coprime array. In the physical radar array, empty array element positions have no receiving devices. Therefore, it is necessary to calculate or approximate the echo signal by the existing data to complete the data of the non-complete arrays (redundancy-removed coprime array) to the data of the complete arrays, making the completed data as similar as possible to the data of a full array without cavities.

In one specific implementation of the present disclosure, based on the redundancy-removed coprime array $P'_{min}$ formed based on the undirected graph S' in step S10, the corresponding poor joint array $S^+_{min}$ is obtained by the equation (2) and (3).

Receiving P (P<L) far-field narrow-band signals from different angles:

$$x(t) = \sum_{p=1}^{P} a(\theta_p)s_p(t) + n(t) = As(t) + n(t), \qquad (8)$$

where $s(t)=[s_1(t), s_2(t), \ldots, s_P(t)]^T$ represent the received time-domain signals, in $A=[a(\theta_1), a(\theta_2), \ldots, a(\theta_P)]$, the array-directed vector of the p-th signal source can be expressed as below:

$$a(\theta_p) = \left[1, e^{-j\frac{2\pi}{\lambda}\rho'_1 \sin(\theta_p)}, \ldots, e^{-j\frac{2\pi}{\lambda}\rho'_{(\eta-1)} \sin(\theta_p)}\right]^T, \qquad (9)$$

where $\rho'_i \in P'_{min}$, $i=1, 2, \ldots, \eta$; $\lambda$ is wavelength of the signal; $\theta_p$ is the DoA of the p-th signal source.

Finally, by the equation (4) zero-filling the cavity of the received signal x(t) to $x_0(t)$.

In step S22, the one-bit quantization is performed to the completed echo data obtained from step S21 and the process of the one-bit quantization may adopt one bit to represent each data point after quantification. The data point is divided into two categories (e.g., positive quantization is +1 and negative quantization is −1) by comparing the relationship between the data and a threshold.

In step S23, the step of constructing a completion problem corresponding to the redundancy-removed coprime array refers to the problem of representing the one-bit quantization data obtained in step S22 as a matrix form. Specifically, a sparse Toeplitz Matrix is formed based on the received signal of the poor joint array. The matrix completion problem is usually to solve one low-rank Toeplitz Matrix, and the solution process is usually processed by the SVT. By performing a singular value decomposition for the matrix and applying a thresholding operation to trim the smaller singular value, so as to achieve the low-rank approximation of the matrix, while at the same time to retain the main components of the signal. After finishing the SVT solution, the completed Toeplitz Matrix is used to simulate one target radar array without cavities.

In summary, in steps S21, S22, and S23, first obtaining uncompleted radar array data; then strikingly reconstructing or completing the data by the one-bit quantization and the SVT solution to simulate data of a complete array. This ultimately makes the redundancy-removed coprime radar array in practical application operating like one complete array, thereby optimizing the performance of radar array while reducing the cost and complexity.

In one implementation, the step of performing the one-bit quantization to the completed echo data to determine a received signal of a poor joint array further includes:

S221, performing the one-bit quantization to the completed echo data to obtain a one-bit signal;

S222, obtaining a covariance matrix estimation of the one-bit signal and performing a vectorization to the covariance matrix estimation to obtain the received signal of the poor joint array.

In an implementation of the present disclosure, the step of performing the one-bit quantization on the completed echo data $x_0(t)$ adopts equation below:

$$y(t) = \frac{1}{\sqrt{2}} [\text{sign}(\text{real}\{x(t)\}) + j \cdot \text{sign}(\text{imag}\{x(t)\})], \quad (10)$$

Where real{·} and imag{·} represent real and imaginary parts of a complex number, respectively, $$\text{sign}(\cdot) = \begin{cases} 1, & \geq 0 \\ -1, & < 0 \end{cases}$$

is an operation on symbol table.

The covariance matrix estimation of the quantized one-bit signal y(t) is represented by the following equation:

$$\tilde{R}_{yy} = \frac{1}{T} \sum_{t=1}^{T} y[t] y^H[t], \quad (11)$$

where $(\cdot)^H$ is a conjugate operation; T is the quantity of snapshots in time domain sampling.

Then removing repeated virtual array elements by vectorizing the covariance matrix to obtain the received signal $Z_0$=unique(z) of the poor joint array.

The process of removing repeated virtual array elements by vectorizing the covariance matrix to obtain the received signal of the poor joint array is represented as below:

$$z = vec(\tilde{R}_{yy}) = (A^* \circ A)\sigma + \sigma_n^2 vec(I_n), \quad (12)$$

where ∘ is Khatri-Rao product; $\sigma = [\sigma_1^2, \ldots, \sigma_P^2]$ is signal power; vec(·) represents vectorizing the matrix by columns.

In one implementation, the step of based on the received signal of the poor joint array, constructing a completion problem corresponding to the redundancy-removed coprime array further includes following steps of:

S231, constructing a Toeplitz Matrix based on the received signal of the poor joint array;

S232, taking an observation-matrix minimization problem corresponding to the Toeplitz Matrix as an initial completion problem corresponding to the redundancy-removed coprime array;

S233, relaxing the initial completion problem into a convex completion problem by a nuclear norm.

In step S231, all elements of each row of the Toeplitz Matrix are offset one column to the right, so that all the elements located on a diagonal line (from top left to bottom right) have the same value. In signal processing, the Toeplitz Matrix is used to represent the output of a Linear Time Invariant (LTI) system, reflecting time-series signals received by each array element in the array.

In step S232, the initial completion problem refers to finding one Toeplitz Matrix that matches the signal received by the radar and has a minimal possible rank. A purpose thereof is to find a signal estimation that reflects the actual signal as much as possible but is expressed by least parameters or elements.

In step S233, the initial completion problem may be a non-convex problem since the non-convex problem has multiple local optimal solutions possibly which is extremely difficult to solve. Therefore, the problem is relaxed as a convexity problem by introducing the nuclear norm (the sum of the singular values of a matrix). In machine learning and optimization theory, convexity problems are relatively easy to solve, because they have only one local optimal solution. The purpose of adding the nuclear norm is to ensure that a rank of the Toeplitz Matrix is as low as possible while retaining the rank.

In one implementation of the present disclosure, constructing the Toeplitz Matrix based on the poor joint array adopts following equation:

$$\tilde{R} = Toe(z_0), \quad (13)$$

where the quantity of signal sources P is smaller than array aperture L, therefore the Toeplitz Matrix $\tilde{R}$ is low-rank. The problem of zero value of the completion matrix may be defined as the following optimization problem:

$$\min_{\tilde{Z}} \text{rank}(\tilde{Z}) \quad (14)$$

$$\text{s.t. } \tilde{Z}_\Omega = \tilde{R}_\Omega,$$

where $\Omega$ is a set of observed elements, i.e. positions of nonzero elements of $\tilde{R}$; $\tilde{Z}_\Omega$ is an observation matrix of forming matrix $\tilde{Z}$:

$$\tilde{Z}_\Omega = \begin{cases} \tilde{Z}(i,j), (i,j) \in \Omega \\ 0, (i,j) \notin \Omega \end{cases}, \quad (15)$$

where $\tilde{Z}(i,j)$ is an element of row i-th, column j-th in the matrix $\tilde{Z}$.

Since in the equation (12), the optimization problem is non-convex, it can be relaxed as the optimization problem below:

$$\min_{\tilde{Z}} \text{rank } \|\tilde{Z}\|_* \quad (16)$$
$$\text{s.t. } \tilde{Z}_\Omega = \tilde{R}_\Omega,$$

where $\|\cdot\|_*$ represents nuclear norm.

The optimization problem mentioned above may be solved by the SVT solution.

First, performing a normalization algorithm on the equation (14):

$$\min_{\tilde{Z}} \tau\|\tilde{Z}\|_* + \frac{1}{2}\|\tilde{Z}\|_F^2 \quad (17)$$
$$\text{s.t. } \tilde{Z}_\Omega = \tilde{R}_\Omega,$$

where $\|\cdot\|_*$ represents Frobenius norm of a matrix, i.e. open root of the sum of squares of each element in the matrix; r is fixed constant.

Then, constructing the Lagrange functions to transform the equation (15) into an unconstrained optimization problem:

$$L(\tilde{Z}, Y) = \|\tilde{Z}\|_* + \frac{1}{2}\|\tilde{Z}\|_F^2 + \langle Y, (\tilde{R} - \tilde{Z})_\Omega \rangle, \quad (18)$$

where Y represents the Lagrange multiplier. Then performing iterative optimization by SVT algorithm:

$$\begin{cases} \tilde{Z}^{(k)} = D_\tau(Y^{(k-1)}) \\ Y^{(k)} = Y^{(k-1)} + \gamma_k \cdot (\tilde{R}_\Omega - \tilde{Z}_\Omega^{(k)}) \end{cases}, \quad (19)$$

where $\gamma_k$ represents step length coefficient of the k-th iterative; threshold operator $D_\tau(Y^{(k-1)})$ is defined as below:

$$D_\tau(Y^{(k-1)}) = UD_\tau(\Lambda)V^T = U\{\text{sign}(\Lambda) \cdot \max(|\Lambda - \tau|, 0)\}V^T, \quad (20)$$

where U and V are left and right singular matrices after singular value decomposition respectively, both of which are orthogonal matrices; $\Lambda$ is main diagonal of a matrix of the singular value; sign ($\Lambda$) represents operation on symbol table; max($|\Lambda - \tau|$,0) represents taking the maximum value of both.

After an SVT iteration, the Toeplitz Matrix $\tilde{R}$ containing cavities is completed as $\tilde{Z}$. Finally, calculating the average of each diagonal line of $\tilde{Z}$ to obtain the completed uniform array $z_1$, that is the target radar array.

In addition, in one implementation of the present disclosure, the Estimation of Signal Parameters using Rotational Invariance Techniques (ESPRIT) DoA can also be solved based on the target radar array.

First, performing space smoothing for a preset number of times on the target radar array to obtain covariance matrix of the target radar array; second, performing eigenvalue decomposition on the covariance matrix and taking a preset number of eigenvalue vectors corresponding to the large eigenvalue feature values as a signal subspace, again using the idea of ESPRIT, solving the rotation operator included in the guide vector to obtain the target angle.

Specifically, performing space smoothing for $T_1 = \lceil N(M+1)/2 \rceil$ times on the target radar array $z_1$, the covariance matrix is shown below:

$$\tilde{R}_z = \frac{1}{T_1}\sum_{t=1}^{T_1} z_1(t:t+T_1) \cdot z_1(t:t+T_1)^H. \quad (21)$$

Performing eigenvalue decomposition on the covariance matrix $\tilde{R}_z$, and taking P of eigenvalue vectors corresponding to the large eigenvalue feature values as signal subspace $\tilde{U}_s$:

$$\tilde{R}_z = \tilde{U}_s \tilde{\Lambda} \tilde{U}_s^H + \sigma^2 \tilde{U}_n \tilde{U}_n^H. \quad (22)$$

Using the idea of ESPRIT, solving the rotation operator included in the guide vector to obtain the target angle. Analyzing the guide vector A and constructing it into two matrices $A_1 = A(1:N-1,:)$ and $A_2 = A(2:N,:)$. The rotation operator $\Phi$ between pulses includes the DoA information of the signal source:

$$A_2 = A_1\Phi, \quad (23)$$

$$\Phi = \text{diag}\{e^{j2\pi d \sin\theta_1/\lambda}, e^{j2\pi d \sin\theta_2/\lambda}, \ldots e^{j2\pi d \sin\theta_P/\lambda}\}. \quad (24)$$

According to the translation invariance of the array, two submatrices with the size of (N−1)*P are constructed by sliding the signal subspaces $\tilde{U}_s$ along the column direction by one unit:

$$U_1 = \tilde{U}_s(1:N-1,:) = A_1 T, \quad (25)$$

$$U_2 = \tilde{U}_s(2:N,:) = A_1 \Phi T, \quad (26)$$

where T is a unique p-dimensional full-rank non-singular matrix.

From the equations (22) and (23) to obtain the equation (27):

$$U_2 = U_1 T^{-1} \Phi T = U_1 \Psi. \quad (27)$$

Since T is invertible matrix and $\Psi$ is similar to $\Phi$, both have same eigenvalue. According to the least squares criterion:

$$\hat{\Psi} = U_1^\dagger U_2. \quad (28)$$

Thus performing eigenvalue decomposition on $\hat{\Psi}$:

$$\hat{\Psi} = D\hat{\Lambda}D^{-1}. \quad (29)$$

Obtaining the DoA of the signal source by the inversion of the eigenvalue diagonal matrix $\hat{\Lambda}$:

$$\theta_p = \frac{\text{angle}\{\hat{\Lambda}(p,p)\}\lambda}{2\pi d}, p = 1, 2, \ldots, P, \quad (30)$$

where angle{·} represents taking the phase angle of the complex number; $\Lambda(p, p)$ represents taking the p-th element of the main diagonal line.

In one implementation of the present disclosure, an experimental realization embodiment of the method for constructing a redundancy-removed coprime radar array based on one-bit quantization of the present disclosure is provided.

Figure 2:
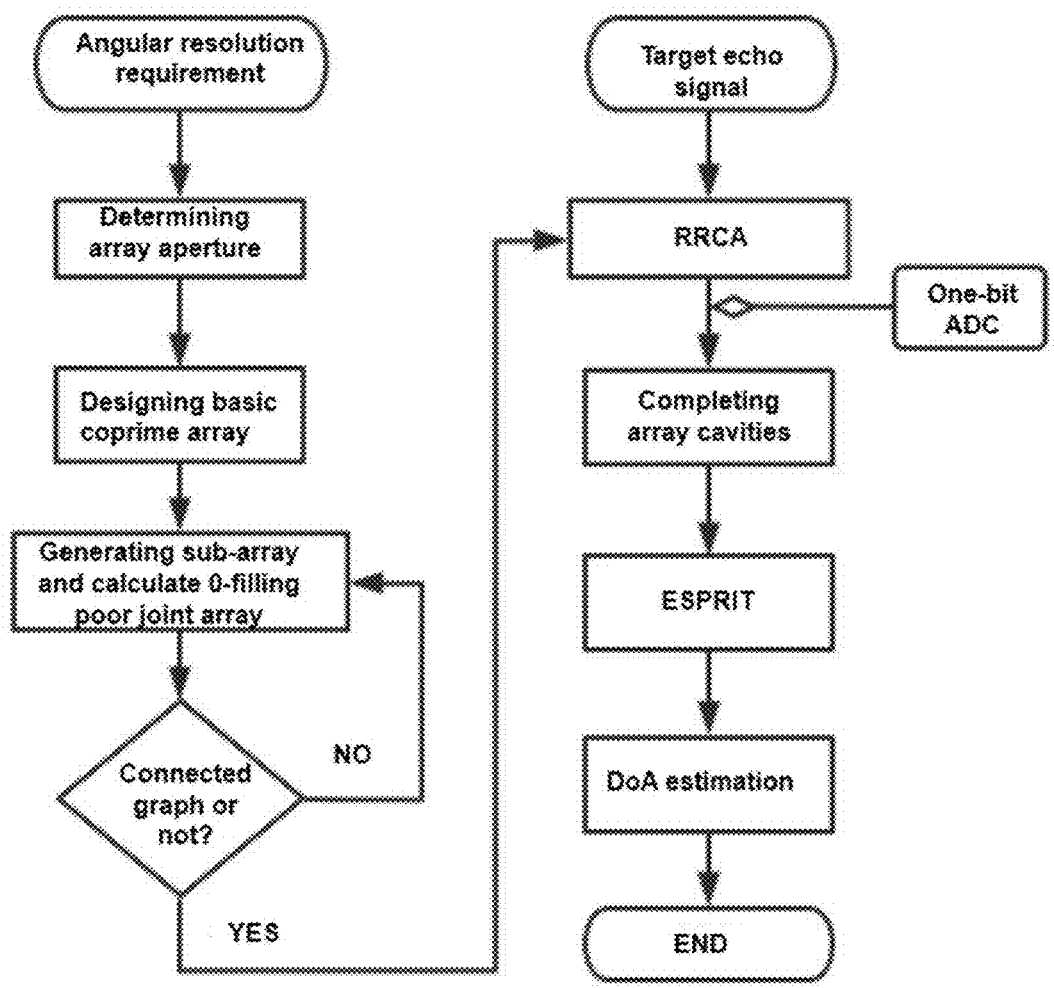
FIG. 2 is a flow diagram of an experimental realization of a method for constructing a redundancy-removed coprime radar array based on one-bit quantization of the present disclosure.

As shown in FIG. 2, the aperture size is calculated according to the requirements of the product angle resolution, that is, the physical distance from the reference array element to the farthest array element; then calculating one array element distribution of a coprime array that meets the aperture; then, based on the coprime array, the redundancy-removed coprime array is designed according to the graph theory; performing one-bit quantification on the received signal of the redundancy-removed coprime array and zero-filling the cavities to construct the Toeplitz Matrix; then the zero value in the Toeplitz Matrix is performed a matrix completion by SVT algorithm; finally, the estimation of DoA is obtained by the ESPRIT method.

The experimental simulation conditions of the present disclosure are as follows: setting a coprime radar array with N=5 and M=7, the quantity of physical array elements is 11; the redundancy-removed coprime array $P_{min}$={0, 5, 15, 21, 28, 30} is obtained by the graph theory, and the quantity of physical array elements is 6; setting the received signal being the 10° of the target echo reach angle and the sampling snapshot number being 256; then the DoA estimation is performed by using the ESPRIT method.

Figure 3:
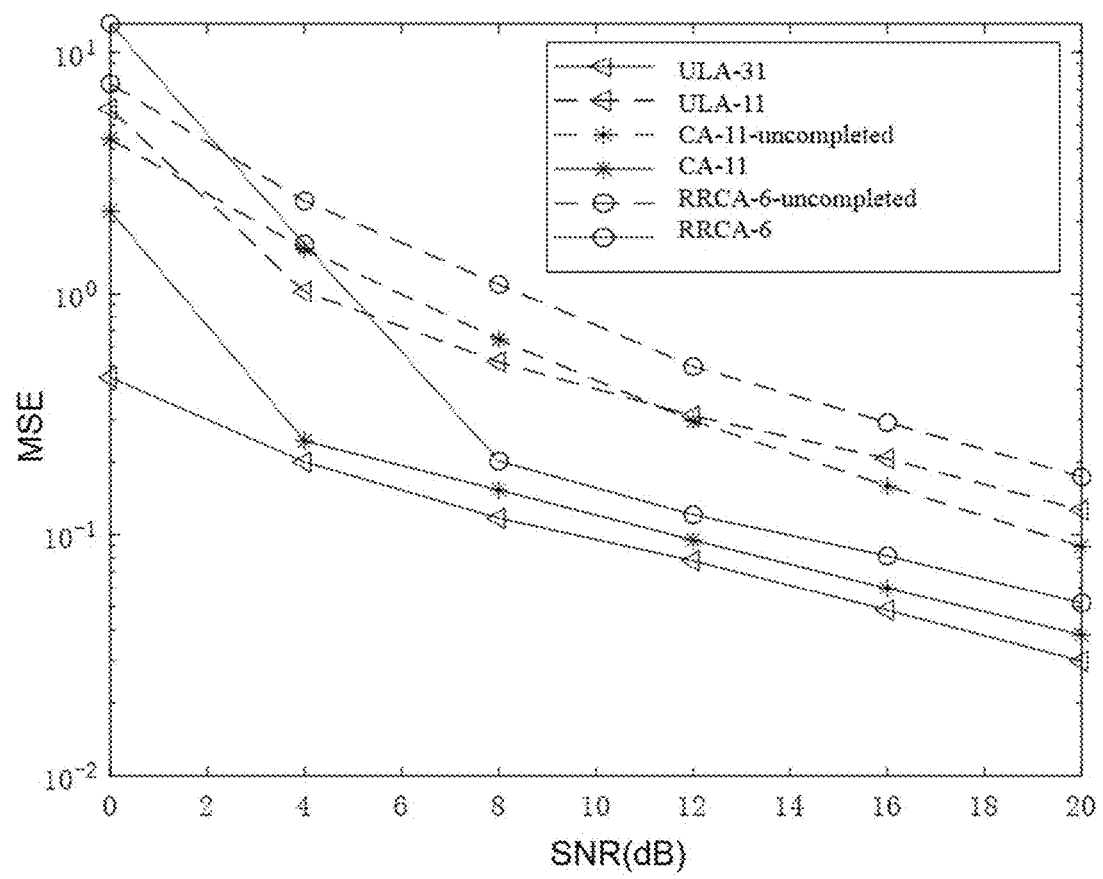
FIG. 3 is a schematic diagram of an experimental DoA estimation error of a method for constructing a redundancy-removed coprime radar array based on one-bit quantization of the present disclosure.

Embodiment 1: 2000 times of Monte Carlo experiments were performed on the Uniform Linear Array with 31 array elements (ULA-31), the Uniform Linear Array with 11 array elements (ULA-11), the uncompleted Coprime Array with 11 array elements (CA-11-uncompleted), the Coprime Array with 11 array elements (CA-11), the uncompleted Redundancy-Removed Coprime Array with 6 array elements (RRCA-6-uncompleted) and the Redundancy-Removed Coprime Array with 6 array elements (RRCA-6), respectively. The experimental result is shown in FIG. 3, the abscissa is signal to noise ratio (SNR), and the ordinate is minimum square error (MSE).

Figure 4:
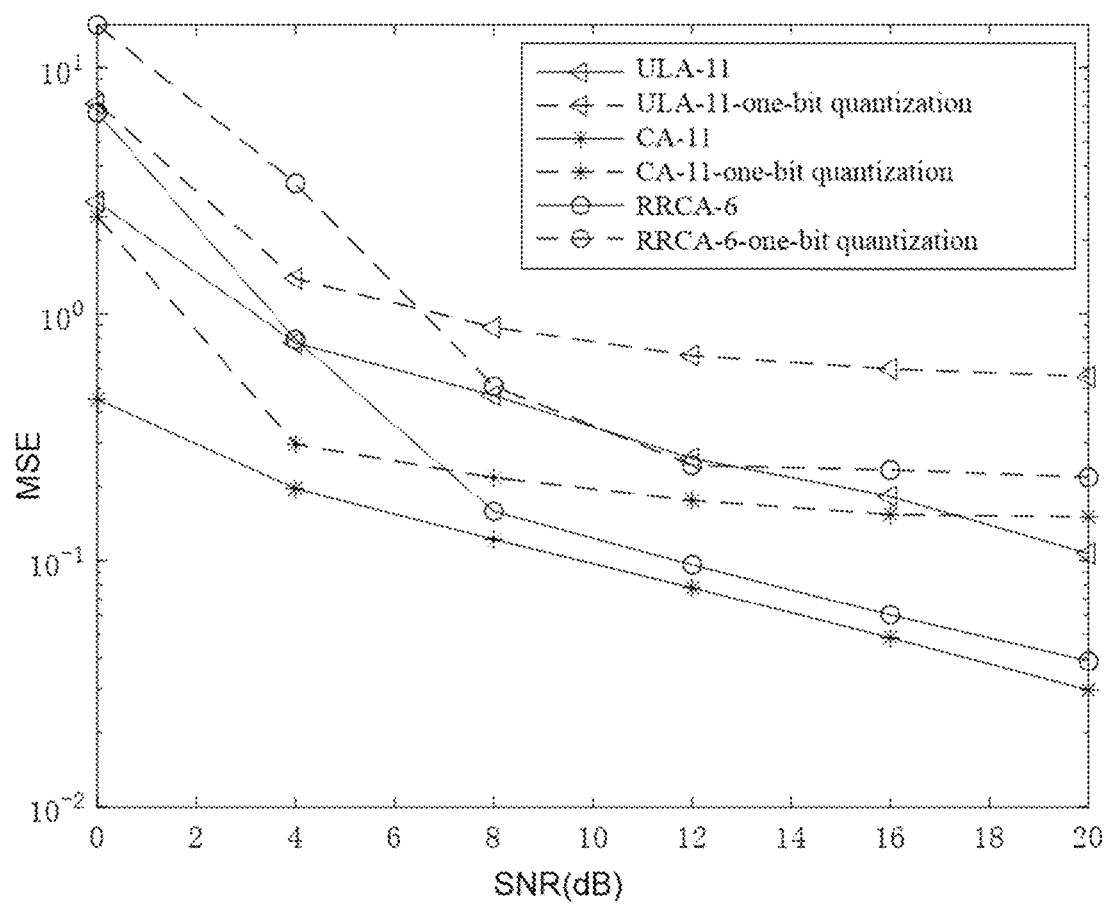
FIG. 4 is a schematic diagram of an experimental DoA estimation error for a one-bit quantization signal of a method for constructing a redundancy-removed coprime radar array based on one-bit quantization of the present disclosure.

Embodiment 2: High-precision data quantification, one-bit quantification, and 2000 times of Monte Carlo experiments were performed on the ULA-11, the one-bit quantization ULA-11 (ULA-11-one-bit quantization), the CA-11, the one-bit quantization CA-11 (CA-11-one-bit quantization), the RRCA-6, and the one-bit quantization RRCA-6 (RRCA-6-one-bit quantization), respectively. The experimental result is shown in FIG. 4, the abscissa is signal to noise ratio (SNR), and the ordinate is minimum square error (MSE).

In summary, the present disclosure provides a method for constructing a redundancy-removed coprime radar array based on one-bit quantization to solve the problem of high cost, high complexity, and high redundancy of the DoA estimation by combining the graph theory method with the one-bit quantization technology. By optimizing an initial SLA structure into RRCA, not only the array freedom of the radar system is improved, but also the quantity of physical array elements is reduced. In addition, the one-bit quantization strategy is adopted, so that the cost of the ADC is reduced, the system power consumption is reduced, and hardware requirements and the data volume processed by subsequent signal processing are effectively reduced, thereby achieving the purpose of reducing the overall system cost.

Meanwhile, the present disclosure can accurately recover the positions of the array element cavities by combining the signal completion technology, thereby utilizing the data of all array apertures and avoiding data waste. In terms of the DoA estimation algorithm, the present disclosure does not require a spectral peak search, which effectively reduces the time complexity of the algorithm and improves the time efficiency of the DoA estimation. Furthermore, although the one-bit quantization destroys the amplitude information of the original signal and introduces harmonic components, the DoA accuracy loss of spatial spectrum estimation of the present disclosure is still in the acceptable range, making it more applicable in practical applications.

Figure 5:
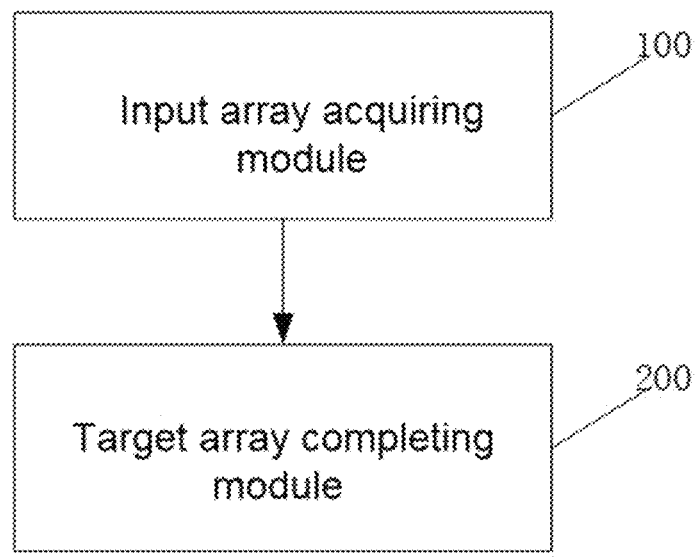
FIG. 5 is a schematic diagram of a structure of a device for constructing a redundancy-removed coprime radar array based on one-bit quantization of the present disclosure.

Based on the above-mentioned method for constructing a redundancy-removed coprime radar array based on one-bit quantization, one implementation of the present disclosure provides a device for constructing a redundancy-removed coprime radar array based on one-bit quantization, as shown in FIG. 5, the device includes:

An input array acquiring module 100, used for obtaining a first sub-array element and a second sub-array element both used for constructing a redundancy-removed coprime radar array, and determining a redundancy-removed coprime array respectively corresponding to the first sub-array element and the second sub-array element by a graph theory method;

A target array completing module 200, used for obtaining target echo data of the redundancy-removed coprime array, and obtaining a target radar array by performing one-bit quantization to the target echo data for completing array cavities; moreover, before the completing, positions of all non-empty array elements in a redundancy coprime array are used to place radars, and before the completing, the radars are not arranged in positions of empty array elements.

Based on the above-mentioned method for constructing a redundancy-removed coprime radar array based on one-bit quantization, one implementation of the present disclosure provides a computer-readable storage medium. One or more programs are stored in the computer-readable storage medium. The one or more programs can be executed by one or more processors, so that the steps of the method for constructing a redundancy-removed coprime radar array mentioned in the above embodiments to are implemented.

Figure 6:
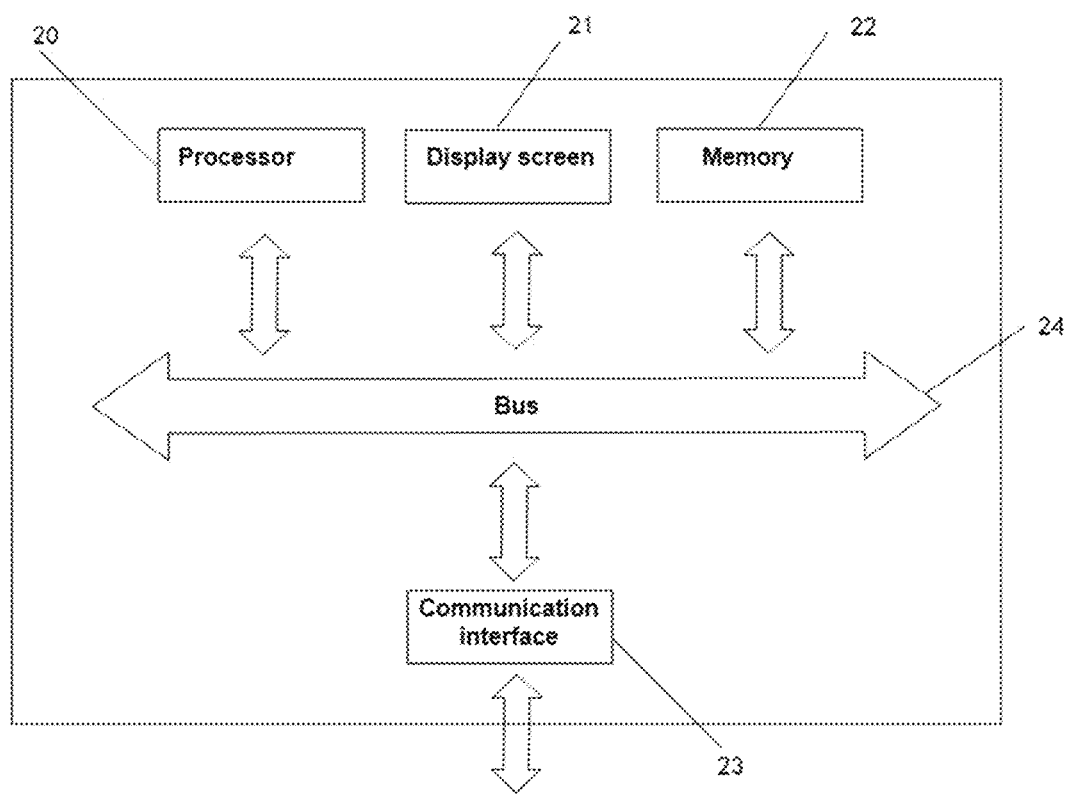
FIG. 6 is a schematic diagram of a structure of a terminal device of the present disclosure.

Based on the above-mentioned method for constructing a redundancy-removed coprime radar array based on one-bit quantization, one implementation of the present disclosure provides a terminal device, as shown in FIG. 6, the terminal device includes at least one processor 20, a display screen 21, and a memory 22. The terminal device further includes a communication interface 23 and a bus 24. Among them, the processor 20, the display screen 21, the memory 22, and the communication interface 23 can communicate with each other by the bus 24. The display screen 21 is set to display the preset user-boot interface in the initial setup mode. The communication interface 23 can transmit information. The processor 20 can call the logic instructions in the memory 22 to execute the method in the above embodiments.

Furthermore, the logic instructions in the memory 22 may be implemented in the form of a software function unit and sold as a separate product and may be stored in a computer-readable storage medium.

The memory 22, as a computer-readable storage medium, may be set to be a storage software program or a computer executable program, for instance, a program instruction or module corresponding to the method in the embodiments of the present disclosure. The processor 20 performs the functional application and data processing stored in the memory 22, by running the software program, instruction or module, i.e. implementing the method in the above embodiments.

The memory 22 may include a storage program area and a storage data area, in which, the storage program area may store an operating system, an application required for at least one function; the storage data area may store data or the like created from the use of the terminal device. Further, the memory 22 may include a high-speed random access memory, or also a non-volatile memory, for instance, U disk, mobile hard disk, Read-Only Memory (ROM), Random Access Memory (RAM), disk, or optical disk etc. which can store program codes, or transient storage media.

Furthermore, the specific process of processors loading and executing the multiple instructions in the terminal device and storage medium is described in detail in the above method and is not stated here.

Finally, it should be noted that the above are only better embodiments of the present disclosure and are not used to limit the present disclosure. Despite the detailed description of this present disclosure in reference to the aforementioned embodiments, those skilled in the art should understand that they may still modify the technical scheme described in the aforementioned embodiments or replace some of the technical features equally; these modifications or replacements do not separate the essence of the corresponding technical scheme from the spirit and scope of the technical schemes of the respective embodiments of the present disclosure.

What is claimed is:

1. A method for constructing a redundancy-removed coprime radar array, comprising:
    obtaining a first sub-array element and a second sub-array element used for constructing a redundancy-removed coprime radar array, and determining a redundancy-removed coprime array respectively corresponding to the first sub-array element and the second sub-array element by a graph theory method; and
    obtaining target echo data of the redundancy-removed coprime array, and obtaining a target radar array by performing one-bit quantization on the target echo data for completing array cavities of the redundancy-removed coprime array;
    wherein, before the completing, positions of all non-empty array elements in a redundancy coprime array are used to place radars, and before the completing, the radars are not arranged in positions of empty array elements;
    wherein the step of determining a redundancy-removed coprime array respectively corresponding to the first sub-array element and the second sub-array element by a graph theory method further comprises:
    constructing an initial coprime array based on the first sub-array element and the second sub-array element;
    fixing a head array element and a tail array element of the initial coprime array;
    traversing all coprime sub-arrays in the initial coprime array and calculating a poor joint array of each coprime sub-array; and
    according to connectivity of an undirected graph corresponding to the poor joint array of each coprime sub-array, selecting the redundancy-removed coprime array from all the coprime sub-arrays; wherein the redundancy-removed coprime array is a smallest coprime sub-array with non-connectivity in the undirected graphs of all coprime sub-arrays.

2. The method for constructing a redundancy-removed coprime radar array according to claim 1, wherein the step of obtaining a first sub-array element and a second sub-array element used for constructing a redundancy-removed coprime radar array, and determining a redundancy-removed coprime array respectively corresponding to the first sub-array element and the second sub-array element by a graph theory method further comprises:
    obtaining an angular resolution of the target radar array, and determining an array aperture of the target radar array according to the angular resolution;
    selecting the first sub-array element and the second sub-array element both used for constructing the redundancy-removed coprime radar array according to the array aperture.

3. The method for constructing a redundancy-removed coprime radar array according to claim 1, wherein the step of according to connectivity of an undirected graph corresponding to the poor joint array of each coprime sub-array, selecting the redundancy-removed coprime array from all the coprime sub-arrays further comprises:
    for each coprime sub-array, taking a non-negative set of array element position sets of the poor joint array of the corresponding coprime sub-array to obtain the poor joint array;
    filling cavity-positions of the coprime sub-array to obtain a Hankel Matrix corresponding to the coprime sub-array and making the Hankel Matrix as the undirected graph; and
    determining the connectivity of the undirected graph based on a preset connectivity judgment basis; wherein the preset connectivity judgment basis is:

$$\forall m \in M = S + S^2 + \ldots + S^{q-1}, m \neq 0,$$

wherein q represents an order of the matrix S, and S represents the Hankel Matrix; and $$\|S\|_1 > 2\lceil L/2 \rceil - 1,$$

wherein L represents the array aperture, and $\|S\|_1$ represents a quantity of total edges of the matrix.

4. The method for constructing a redundancy-removed coprime radar array according to claim 1, wherein the step of obtaining a target radar array by performing one-bit quantization to the target echo data for completing array cavities further comprises:
    performing cavity completion on the target echo data to obtain completed echo data;
    performing one-bit quantization to the completed echo data to determine a received signal of the poor joint array; and
    based on the received signal of the poor joint array, constructing a completion problem corresponding to the redundancy-removed coprime array, and solving the completion problem by using Singular Value Thresholding to obtain the target radar array.

5. The method for constructing a redundancy-removed coprime radar array according to claim 4, wherein the step of performing one-bit quantization to the completed echo data to determine a received signal of the poor joint array further comprises:
    performing the one-bit quantization to the completed echo data to determine a one-bit signal; and
    obtaining covariance matrix estimation of the one-bit signal and performing vectorization to the covariance matrix estimation to obtain the received signal of the poor joint array.

6. The method for constructing a redundancy-removed coprime radar array according to claim 4, wherein the step of based on the received signal of the poor joint array, constructing a completion problem corresponding to the redundancy-removed coprime array further comprises:
  constructing Toeplitz Matrix based on the received signal of the poor joint array;
  taking an observation-matrix minimization problem corresponding to the Toeplitz Matrix as an initial completion problem corresponding to the redundancy-removed coprime array; and
  relaxing the initial completion problem into a convex completion problem by nuclear norm.

7. A non-transitory computer-readable storage medium, wherein a program of the redundancy-removed coprime array is stored in the computer-readable storage medium; when the program is executed by the processor, the steps of the method for constructing a redundancy-removed coprime radar array according to claim 1 are implemented.

8. A device for constructing a redundancy-removed coprime radar array, comprising:
  an input array acquiring module, used for obtaining a first sub-array element and a second sub-array element both used for constructing a redundancy-removed coprime radar array, and determining a redundancy-removed coprime array respectively corresponding to the first sub-array element and the second sub-array element by a graph theory method; and
  a target array completing module, used for obtaining target echo data of the redundancy-removed coprime array, and obtaining a target radar array by performing one-bit quantization on the target echo data for completing array cavities of the redundancy-removed coprime array; wherein before the completing, positions of all non-empty array elements in a redundancy coprime array are used to place radars, and before the completing, the radars are not arranged in positions of empty array elements;
wherein the step of determining a redundancy-removed coprime array respectively corresponding to the first sub-array element and the second sub-array element by a graph theory method further comprises:
constructing an initial coprime array based on the first sub-array element and the second sub-array element;
fixing a head array element and a tail array element of the initial coprime array;
traversing all coprime sub-arrays in the initial coprime array and calculating a poor joint array of each coprime sub-array; and
according to connectivity of an undirected graph corresponding to the poor joint array of each coprime sub-array, selecting the redundancy-removed coprime array from all the coprime sub-arrays; wherein the redundancy-removed coprime array is a smallest coprime sub-array with non-connectivity in the undirected graphs of all coprime sub-arrays.

* * * * *